United States Patent
Tashino et al.

(10) Patent No.: US 12,496,674 B2
(45) Date of Patent: Dec. 16, 2025

(54) GETTERING LAYER FORMING DEVICE AND PROCESSING APPARATUS

(71) Applicant: DISCO CORPORATION, Tokyo (JP)

(72) Inventors: Fumiteru Tashino, Tokyo (JP); Masashi Aoki, Tokyo (JP); Xiaoming Qiu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 405 days.

(21) Appl. No.: 18/187,026

(22) Filed: Mar. 21, 2023

(65) Prior Publication Data

US 2023/0321781 A1    Oct. 12, 2023

(30) Foreign Application Priority Data

Apr. 7, 2022 (JP) .................................. 2022-064009

(51) Int. Cl.
| | |
|---|---|
| B24B 1/04 | (2006.01) |
| H01L 21/304 | (2006.01) |
| H01L 21/322 | (2006.01) |
| H01L 21/67 | (2006.01) |
| H01L 21/687 | (2006.01) |

(52) U.S. Cl.
CPC .............. *B24B 1/04* (2013.01); *H01L 21/304* (2013.01); *H01L 21/3221* (2013.01); *H01L 21/67051* (2013.01); *H01L 21/67092* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 5,518,542 | A | * 5/1996 | Matsukawa | ............... B08B 3/04 |
| | | | | 118/712 |
| 2018/0043501 | A1 | * 2/2018 | Cho | ..................... B24B 53/017 |
| 2018/0050436 | A1 | * 2/2018 | Yamanaka | ............ B24B 37/107 |
| 2019/0314950 | A1 | * 10/2019 | Inoue | ...................... H01L 22/12 |
| 2023/0321781 | A1 | * 10/2023 | Tashino | ............ H01L 21/67057 |

FOREIGN PATENT DOCUMENTS

| | | | |
|---|---|---|---|
| CN | 106181595 A | * 12/2016 | ............. B24B 47/20 |
| JP | H06302567 A | * 10/1994 | |
| JP | 2005329501 A | * 12/2005 | |
| JP | 2006303223 A | * 11/2006 | |

* cited by examiner

*Primary Examiner* — Sylvia Macarthur
(74) *Attorney, Agent, or Firm* — GREER BURNS & CRAIN, LTD.

(57) ABSTRACT

A gettering layer forming device includes a spinner table having a surface for holding a face side of a wafer, and an annular rest surface disposed radially outwardly of the holding surface. An annular member is located on the rest surface surrounding the wafer such that a water bath is defined by the annular member and the wafer. A moving mechanism selectively places the annular member onto the rest surface and moves the annular member away from the rest surface, an abrasive grain nozzle charges free abrasive grains into the water bath, a water nozzle supplies water to the water bath to immerse the wafer in the water, an ultrasonic horn propagates ultrasonic vibrations to the free abrasive grains in the water, and a horizontally moving mechanism moves the ultrasonic horn and the holding table horizontally relative to each other in directions parallel to the holding surface.

7 Claims, 10 Drawing Sheets

GETTERING LAYER FORMING DEVICE AND PROCESSING APPARATUS

BACKGROUND OF THE INVENTION

Field of the Invention

The present invention relates to a gettering layer forming device for forming a gettering layer on a reverse side of a wafer and a processing apparatus incorporating such a gettering layer forming device.

Description of the Related Art

Demands for smaller and lower-profile electronic devices have naturally resulted in an inclination for those electronic devices to incorporate smaller and lower-profile semiconductor devices. According to the customary process for manufacturing semiconductor devices, a semiconductor wafer (hereinafter simply referred to as "wafer") shaped as a circular plate has a number of rectangular areas demarcated on a face side thereof by a plurality of projected dicing lines called streets arrayed in a grid pattern, and devices such as integrated circuits (ICs) and large-scale integration (LSI) circuits are constructed in the respective rectangular areas. The wafer with the devices thereon is cut along the streets into a plurality of semiconductor chips that include the respective devices.

Then, in order to make the individual semiconductor chips smaller and lower in profile, the wafer has its reverse side, i.e., a surface opposite the face side on which the devices are constructed, ground to a predetermined thickness before the wafer is cut along the streets. The wafer is ground by grindstones that are pressed against the reverse side of the wafer while rotating at a high speed. When the reverse side of the wafer is thus ground, a processing strain layer of microcracks each having a size of approximately 1 μm is developed in the reverse side of the wafer. The processing strain layer tends to cause a reduction in the flexural strength of the wafer specifically when the wafer is ground to a thickness of 100 μm or less.

It has been customary to remove the processing strain layer by polishing or etching the ground reverse side of the wafer.

However, removing the processing strain layer by polishing or etching the reverse side of the wafer after the reverses side has been ground is problematic because it is also liable to lose a gettering effect. The gettering effect refers to an effect produced by gettering sites, i.e., crystalline defects or distortions, developed in the wafer or on the reverse side thereof for trapping and securing impurities such as heavy-metal impurities tending to cause metal contamination in the gettering sites.

There has been proposed, in Japanese Patent Laid-open No. 2006-303223, a method of processing a wafer by ultrasonically vibrating free abrasive grains introduced into water in a water bath and immersing a wafer in the water in the water bath with the wafer having a reverse side facing downwardly, so that the ultrasonically vibrating free abrasive grains impinge upon the reverse side of the wafer thereby to form a gettering layer on the reverse side of the wafer.

SUMMARY OF THE INVENTION

According to the method proposed in Japanese Patent Laid-open No. 2006-303223, however, since the free abrasive grains are not held in contact with the reverse side of the wafer at all times, it takes a long period of time to form a gettering layer on the reverse side of the wafer.

It is therefore an object of the present invention to provide a gettering layer forming device and a processing apparatus that are capable of forming a gettering layer on a reverse side of a wafer that has been ground, efficiently in a short period of time.

In accordance with an aspect of the present invention, there is provided a gettering layer forming device for forming a gettering layer on a reverse side of a wafer, including a holding table having a holding surface for holding a face side of the wafer under suction thereon and an annular rest surface disposed radially outwardly of the holding surface, an annular member for being placed on the annular rest surface in surrounding relation to the wafer held on the holding surface such that a water bath is defined by the annular member and the wafer, a moving mechanism for selectively placing the annular member onto the annular rest surface and moving the annular member away from the annular rest surface, an abrasive grain charger for charging free abrasive grains into the water bath, a water nozzle for supplying water to the water bath to immerse the wafer in the water in the water bath, an ultrasonic horn for propagating ultrasonic vibrations to the free abrasive grains in the water in the water bath, and a horizontally moving mechanism for moving the ultrasonic horn and the holding table horizontally relatively to each other in directions parallel to the holding surface, in which the gettering layer is formed on the reverse side of the wafer held on the holding surface and immersed in the water in the water bath by the free abrasive grains to which the ultrasonic vibrations are propagated by the ultrasonic horn.

In accordance with another aspect of the present invention, there is provided a processing apparatus for processing a reverse side of a wafer, including a chuck table having a chuck holding surface for holding a face side of the wafer thereon and an annular rest surface disposed radially outwardly of the chuck holding surface, a processing mechanism for processing the wafer held on the chuck table, and a gettering layer forming device for forming a gettering layer on the reverse side of the wafer, in which the gettering layer forming device includes an annular member for being placed on the annular rest surface in surrounding relation to the wafer held on the chuck holding surface such that a water bath is defined by the annular member and the wafer, an abrasive grain charger for charging free abrasive grains into the water bath, a water nozzle for supplying water to the water bath to immerse the wafer in the water in the water bath, an ultrasonic horn for propagating ultrasonic vibrations to the free abrasive grains in the water in the water bath, and a horizontally moving mechanism for moving the ultrasonic horn and the chuck table horizontally relatively to each other in directions parallel to the chuck holding surface, and a gettering layer is formed on the reverse side of the wafer held on the chuck holding surface and immersed in the water in the water bath by the free abrasive grains to which the ultrasonic vibrations are propagated by the ultrasonic horn.

In accordance with a further aspect of the present invention, there is provided a processing apparatus for processing a reverse side of a wafer, including a chuck table having a chuck holding surface for holding a face side of the wafer thereon, a processing mechanism for processing the reverse side of the wafer held on the chuck holding surface, a spinner cleaning mechanism for cleaning the wafer, a delivery mechanism for delivering the wafer from the chuck table to the spinner cleaning mechanism, and a gettering layer forming device for forming a gettering layer on the reverse side of the wafer, in which the spinner cleaning mechanism includes a spinner table having a spinner holding surface for holding the face side of the wafer thereon and an annular rest surface disposed radially outwardly of the spinner holding surface, a cleaning nozzle for ejecting a cleaning fluid to the reverse side of the wafer held on the spinner holding surface, a rotating mechanism for rotating the spinner table about an axis aligned with the center of the spinner holding surface, and a gettering layer forming device for forming a gettering layer on the reverse side of the wafer, the gettering layer forming device includes an annular member for being placed on the annular rest surface in surrounding relation to the wafer held on the spinner holding surface such that a water bath is defined by the annular member and the wafer, an abrasive grain charger for charging free abrasive grains into the water bath, and an ultrasonic horn for propagating ultrasonic vibrations to the free abrasive grains in the water in the water bath, the rotating mechanism rotates the spinner table while the wafer held on the spinner holding surface is being immersed in water supplied from the cleaning nozzle to the water bath, and a gettering layer is formed on the reverse side of the wafer held on the spinner holding surface and immersed in the water in the water bath by the free abrasive grains to which the ultrasonic vibrations are propagated by the ultrasonic horn.

According to the present invention, when ultrasonic vibrations are propagated from the ultrasonic horn to the free abrasive grains contained in the water in the water bath, the free abrasive grains are ultrasonically vibrated to leave countless minuscule scratches on the reverse side of the wafer, thereby forming a gettering layer on the reverse side of the wafer. According to the present invention, the free abrasive grains that are contained in the water are ultrasonically vibrated while being kept on the reverse side of the wafer at all times, so that the free abrasive grains move in lateral directions and oblique directions and leave criss-cross minuscule scratches on the reverse side of the water. Consequently, a gettering layer for trapping and securing impurities such as heavy-metal impurities tending to cause metal contamination in the gettering sites is efficiently formed on the reverse side of the wafer within a short period of time.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will be described in detail below with reference to the accompanying drawings.

Wafer Grinding Apparatus

An overall structure of an apparatus for grinding a wafer as a processing apparatus according to the present embodiment will be described below with reference to FIG. 1. The grinding apparatus, denoted by 1 in FIG. 1, operates to grind a reverse side, i.e., an upper surface in FIG. 1, of a wafer 100 as a workpiece, which is in the shape of a circular plate. The grinding apparatus 1 includes components as described below. The grinding apparatus is illustrated in reference to a three-dimensional coordinate system having X-, Y-, and Z-axes indicated respectively by the arrows +X and −X, +Y and −Y, and +Z and −Z. The X-axis and the Y-axis lie on a horizontal plane, whereas the Z-axis extends vertically perpendicularly to the horizontal plane. X-axis directions, i.e., leftward and rightward directions, extend parallel to the X-axis and include +X and −X directions, and Y-axis directions, i.e., forward and rearward directions, extend parallel to the Y-axis and include +Y and −Y directions. Z-axis directions, i.e., upward and downward directions, extend parallel to the Z-axis perpendicularly to the X-axis and the Y-axis and include +Z and −Z directions.

Figure 1:
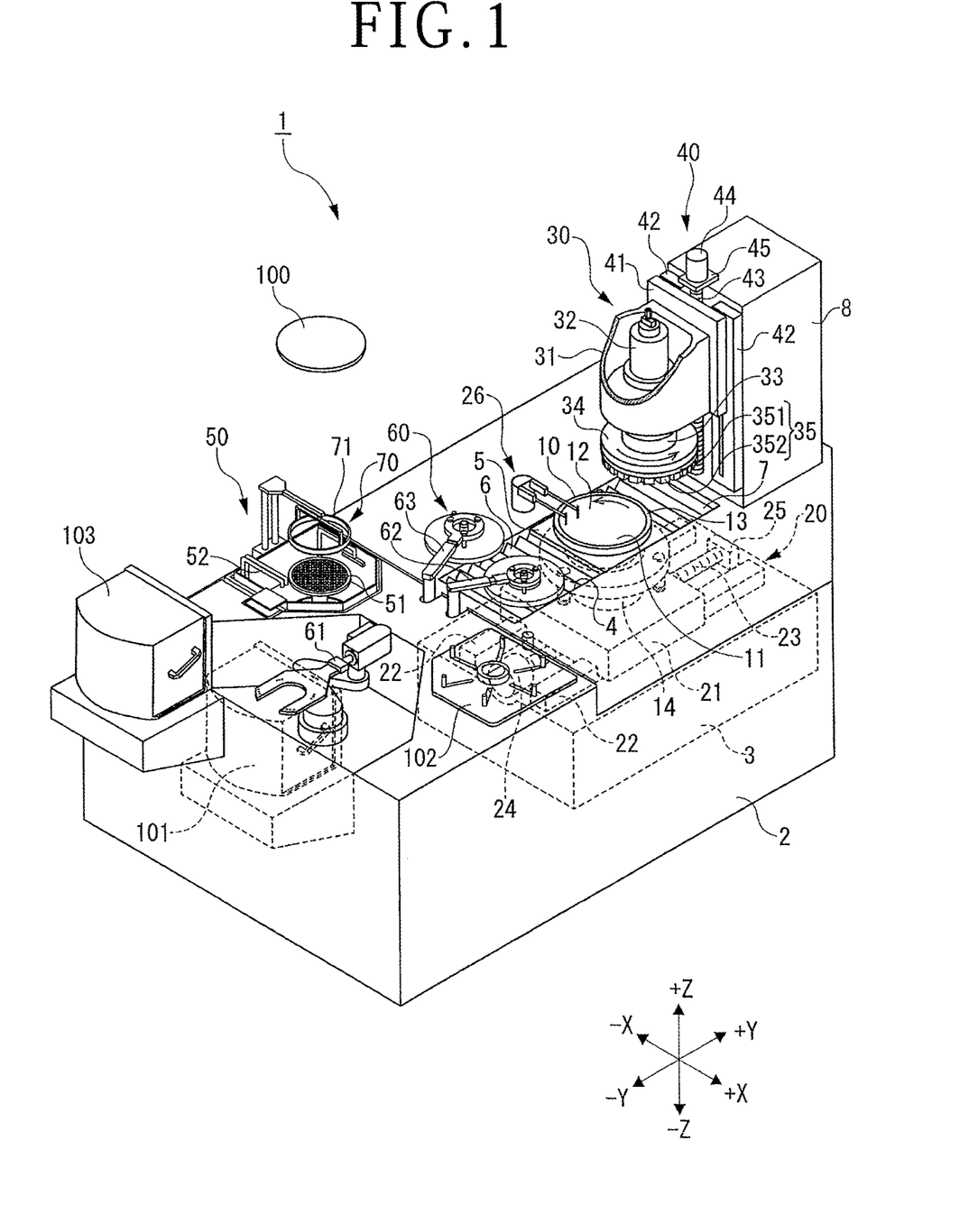
FIG. 1 is a perspective view, partly cut away, of a grinding apparatus as a processing apparatus according to an embodiment of the present invention.

The grinding apparatus 1 includes, as major components, a chuck table 10 for holding a face side, i.e., a lower surface in FIG. 1, of the wafer 100 on an upper surface thereof, i.e., a chuck holding surface 11, a grinding mechanism 30 as a processing mechanism for grinding the reverse side of the wafer 100 on the chuck holding surface 11, a spinner cleaning mechanism 50 for cleaning the wafer 100, a delivery mechanism 60 for delivering the wafer 100, and a gettering layer forming device 70 for forming a gettering layer on the reverse side of the wafer 100. The gettering layer forming device 70 according to the present embodiment is integrally combined with the spinner cleaning mechanism 50, and will be described in structural detail later.

The wafer 100 is made of a base material of monocrystalline silicon and has a plurality of devices, not illustrated, constructed on the face side thereof that faces downwardly in FIG. 1. The devices are protected by a protective tape, not illustrated, affixed to the face side of the wafer 100. When the grinding apparatus 1 is in operation, the face side of the wafer 100 is held under suction on the chuck holding surface 11 of the chuck table 10, and the reverse side of the wafer 100 is ground by the grinding mechanism 30.

Structural details of the major components of the grinding apparatus 1, i.e., the chuck table 10, the grinding mechanism 30, the spinner cleaning mechanism 50, the delivery mechanism 60, and the gettering layer forming device 70, will be described below.

(Chuck Table 10)

The chuck table 10 includes a member shaped as a circular plate and includes a porous member 12 shaped as a circular plate made of porous ceramic and disposed centrally in the chuck table 10. The porous member 12 has an upper surface acting as the chuck holding surface 11 that holds the wafer 100 under suction thereon. The chuck table 10 has an outer circumferential upper surface extending around the porous member 12 as an annular rest surface 13.

The chuck table 10 is rotatable about a central axis thereof at a predetermined speed by a rotating mechanism 14 including an electric motor, not illustrated, as a drive source disposed below the chuck table 10. The chuck table 10 is also reciprocally movable in the Y-axis directions by a horizontally moving mechanism 20 disposed below the chuck table 10. The horizontally moving mechanism 20 is constructed as follows.

As illustrated in FIG. 1, the horizontally moving mechanism 20 is a mechanism for reciprocally moving the chuck table 10 in horizontal directions, i.e., the Y-axis directions, parallel to the chuck holding surface 11. The horizontally moving mechanism 20 is disposed on an internal base 3 shaped as a rectangular block housed in a base 2 shaped as a rectangular box that is elongate in the Y-axis directions, i.e., the forward and rearward directions. The horizontally moving mechanism 20 includes a slider 21 slidably mounted on a pair of left and right guide rails 22 disposed on the internal base 3 and extending parallel to each other along the Y-axis directions. The slider 21 is slidable in the Y-axis directions along the guide rails 22. The chuck table 10 and the rotating mechanism 14 including the electric motor, etc. are supported on the slider 21 and hence are movable with the slider 21 in the Y-axis directions along the guide rails 22.

A ball screw shaft 23 extending in the Y-axis directions and rotatable about its own central axis is disposed between the guide rails 22 on the internal base 3. The ball screw shaft 23 has an end in the −Y direction, i.e., a left end in FIG. 1, coupled to a reversible electric motor 24 as a drive source. The ball screw shaft 23 has an opposite end in the +Y direction, i.e., a right end in FIG. 1, rotatably supported by a bearing 25 erected on the internal base 3. A nut, not illustrated, fixed to and protruding downwardly from the slider 21 is operatively threaded over the ball screw shaft 23.

When the electric motor 24 is energized to rotate the ball screw shaft 23 about its own central axis in one direction or the other, the nut operatively threaded over the ball screw shaft 23 is moved along the ball screw shaft 23, moving the slider 21 along the guide rails 22 in the +Y or −Y direction. Therefore, the chuck table 10 is also moved in the +Y or −Y direction in unison with the slider 21. As a result, the wafer 100 held under suction on the chuck holding surface 11 of the chuck table 10 is also moved in the +Y or −Y direction. The electric motor 24 is electrically connected to a controller, not illustrated, and is controlled in its operation by the controller.

As illustrated in FIG. 1, the base 2 has a rectangular opening 4 that is elongate in the Y-axis directions defined in an upper surface thereof. The chuck table 10 is positioned in the opening 4. A portion of the opening 4 around the chuck table 10 is covered with a cover 5 shaped as a rectangular plate that is movable with the chuck table 10, and the remaining portions of the opening 4 that lie forwardly and rearwardly of the cover 5 are covered respectively with bellows-shaped covers 6 and 7 that are extensible and contractible when the cover 5 is moved in the opening 4. Therefore, no matter where the chuck table 10 may be positioned in the opening 4 along the Y-axis, the opening 4 is closed by the cover 5 and the covers 6 and 7 at all times, so that foreign matter such as dust or dirt particles will be prevented from entering the base 2 through the opening 4.

(Grinding Mechanism 30)

As illustrated in FIG. 1, the grinding mechanism 30 includes a holder 31 having an upwardly open portion, a spindle motor 32 as a rotational drive source fixedly disposed vertically in the upwardly open portion of the holder 31, a spindle 33 connected to and rotatable by the spindle motor 32 about its own central axis, a wheel mount 34 shaped as a circular plate attached to a lower end of the spindle 33, and a grinding wheel 35 detachably mounted on a lower surface of the wheel mount 34. The grinding wheel 35 includes a base 351 shaped as a circular plate mounted on the lower surface of the wheel mount 34 and a plurality of grindstones 352 arranged in an annular array and attached as a processing tool to a lower surface of the base 351. The grindstones 352 as the processing tool that will grind the wafer 100 on the chuck table 10 have respective lower surfaces that jointly make up a processing surface, i.e., a grinding surface, to be brought into abrasive contact with the wafer 100. The spindle motor 32 is electrically connected to the controller, not illustrated, and is controlled in its operation by the controller.

The grinding mechanism 30 can be lifted and lowered in vertical directions perpendicular to the chuck holding surface 11 of the chuck table 10, i.e., the Z-axis directions, by a vertically moving mechanism 40. As illustrated in FIG. 1, the vertically moving mechanism 40 is disposed on an end face facing in the −Y direction, i.e., a front surface, of a column 8 shaped as a rectangular box erected vertically on an end portion positioned in the +Y direction, i.e., a rear end portion, of the upper surface of the base 2. The vertically moving mechanism 40 selectively lifts and lowers a vertically movable plate 41 shaped as a rectangular plate attached to a rear surface of the holder 31, together with the holder 31, the spindle motor 32 and the grinding wheel 35 held by the holder 31, etc., in the Z-axis directions along a pair of left and right guide rails 42. The guide rails 42 are mounted on the front surface of the column 8 and extend vertically parallel to each other.

A ball screw shaft 43 extending in the Z-axis directions and rotatable about its own central axis is disposed between the guide rails 42. The ball screw shaft 43 has an upper end in the +Z direction coupled to a reversible electric motor 44 as a drive source. The electric motor 44 is vertically mounted on an upper end face of the column 8 by a bracket 45 shaped as a rectangular plate attached to the upper end face of the column 8. The ball screw shaft 43 has a lower end in the −Z direction rotatably supported on the column 8. A nut, not illustrated, fixed to and protruding horizontally rearwardly in the +Y direction from the vertically movable plate 41 is operatively threaded over the ball screw shaft 43.

When the electric motor 44 is energized to rotate the ball screw shaft 43 about its own central axis in one direction or the other, the nut operatively threaded over the ball screw shaft 43 is moved along the ball screw shaft 43, moving the vertically movable plate 41 together with the grinding mechanism 30 along the guide rails 42 in the +Z or −Z direction. As illustrated in FIG. 1, a thickness measuring instrument 26 for measuring the thickness of the wafer 100 while it is being ground by the grinding mechanism 30 is disposed on the base 2 in the vicinity of the chuck table 10. The electric motor 44 is electrically connected to the controller, not illustrated, and is controlled in its operation by the controller.

(Spinner Cleaning Mechanism 50)

The spinner cleaning mechanism 50 is a mechanism for cleaning the reverse side of the wafer 100 on which a gettering layer has been formed by the gettering layer forming device 70 after the grinding of the reverse side of the wafer 100. The spinner cleaning mechanism 50 includes a spinner table 51 rotatable about its central axis while holding the wafer 100 that has been processed and a water nozzle 52 for ejecting a cleaning fluid toward the reverse side of the wafer 100 on the spinner table 51.

(Delivery Mechanism 60)

The delivery mechanism 60 includes a loading and unloading robot 61, a first delivery arm 62, and a second delivery arm 63. The loading and unloading robot 61 performs a function to take one wafer 100 at a time out of a cassette 101 that stores a plurality of wafers 100 to be ground, delivers the wafer 100 to a positioning table 102 while holding the wafer 100 under suction, delivers the wafer 100 whose reverse side has been cleaned by the spinner cleaning mechanism 50 to the cassette 103, and stores the wafer 100 back into the cassette 103.

The first delivery arm 62 serves a function to hold the wafer 100 to be ground that has been positioned by the positioning table 102 and deliver the wafer 100 to the chuck table 10. The second delivery arm 63 serves a function to hold the wafer 100 that has been ground and deliver the wafer 100 from the chuck table 10 to the spinner table 51 of the spinner cleaning mechanism 50.

(Gettering Layer Forming Device 70)

Figure 2:
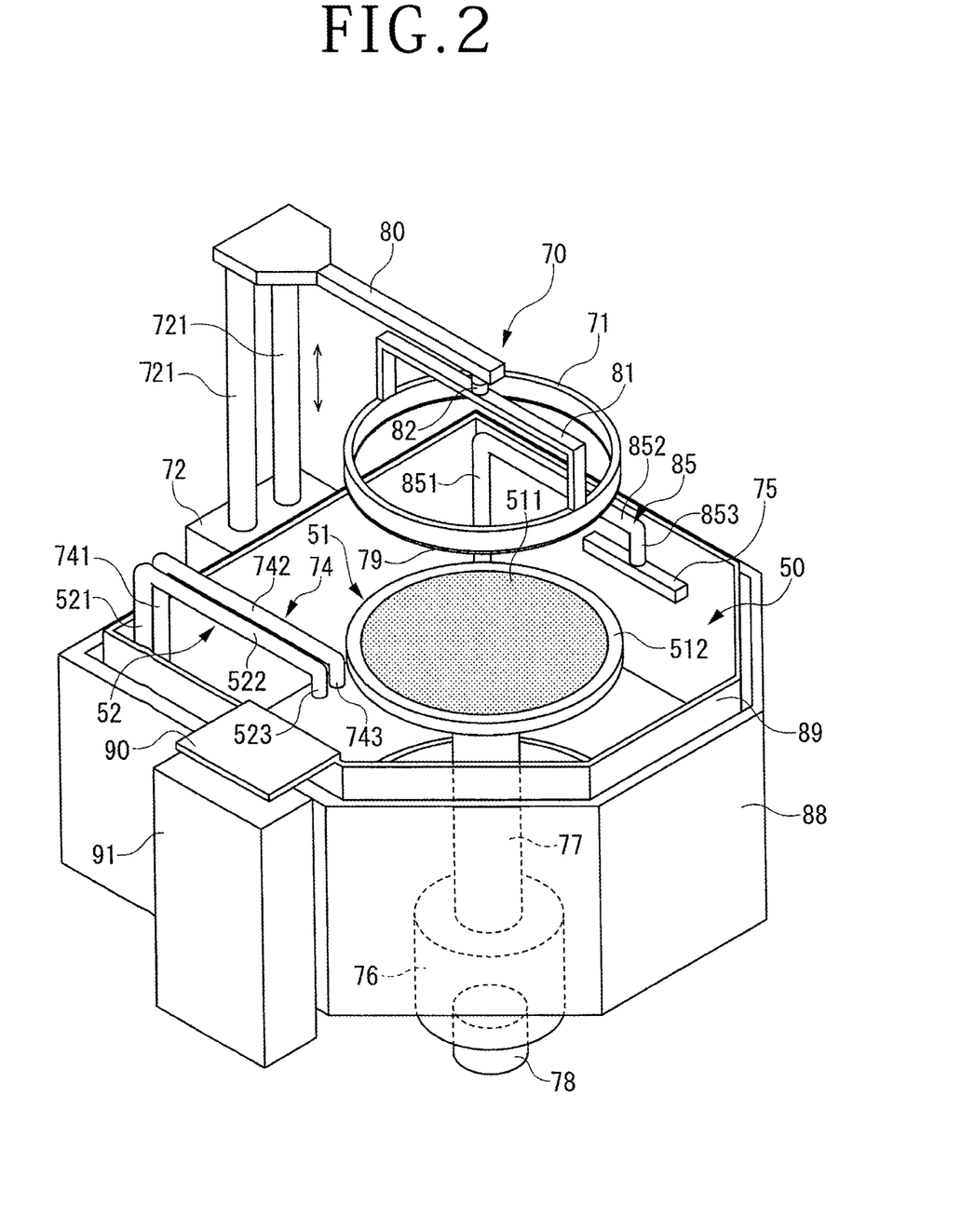
FIG. 2 is a perspective view of the grinding apparatus, illustrating a state of operation before an annular member of a gettering layer forming device according to the present embodiment is placed on a spinner table.

The gettering layer forming device 70 is integrally combined with the spinner cleaning mechanism 50 as described above. Structural details of the gettering layer forming device 70 will be described below with reference to FIG. 2. As illustrated in FIG. 2, the gettering layer forming device 70 is a device for forming a gettering layer on the reverse side of the wafer 100. The gettering layer forming device 70 includes the spinner table 51 combined with the spinner cleaning mechanism 50, an annular member 71, a moving mechanism 72 for vertically moving the annular member 71, an abrasive grain nozzle 74 as an abrasive grain charger for charging free abrasive grains into a water bath 73 (see FIGS. 3 through 7) provided by the annular member 71 and the wafer 100, a water nozzle 52, which is also used as a cleaning nozzle for ejecting water as a cleaning fluid to clean the wafer 100, for supplying water to the water bath 73, an ultrasonic horn 75 for propagating ultrasonic vibrations to the free abrasive grains in the water bath 73, and a horizontally moving mechanism, which functions as a turning mechanism 83 (see FIG. 5) to be described later, for horizontally turning the abrasive grain nozzle 74 and the water nozzle 52 relatively to a spinner holding surface 511 of the spinner table 51.

The spinner table 51 includes an annular rest surface 512 extending around the spinner holding surface 511 that is of a circular shape and provided as an upper surface thereof. The spinner table 51 is mounted on an upper end of a rotational shaft 77 extending vertically upwardly from a rotating mechanism 76 that is disposed below the spinner table 51. The rotating mechanism 76 has a lower end to which a rotary joint 78 is coupled. The rotating mechanism 76 is electrically connected to the controller, not illustrated, and is controlled in its operation by the controller.

The annular member 71 includes a ring member having such a size that it can be placed on the spinner rest surface 512 of the spinner table 51. An annular elastic packing 79 is attached as a seal member to a lower surface of the annular member 71. The moving mechanism 72 for vertically moving the annular member 71 includes an air cylinder or the like, and includes a pair of vertical rods 721 that are vertically movable and an arm 80 extending horizontally from the upper ends of the rods 721. The annular member 71 is horizontally rotatably supported on a distal end of the arm 80. Specifically, a portal-shaped support frame 81 is attached to the annular member 71 and has a horizontal portion that is supported at its longitudinally central point on the distal end of the arm 80 by a universal joint 82. Therefore, the annular member 71 is rotatable about the universal joint 82 with respect to the arm 80. The universal joint 82 is positioned in vertical alignment with the center of the spinner holding surface 511 of the spinner table 51. The universal joint 82 may be replaced with a rotary joint.

The water nozzle 52 and the abrasive grain nozzle 74 include respective vertical portions 521 and 741 rising vertically, respective horizontal portions 522 and 742 bent at a right angle from upper ends of the vertical portions 521 and 741 and extending horizontally, and respective vertical portions 523 and 743 bent at a right angle from distal ends of the horizontal portions 522 and 742 and extending downwardly. The vertical portions 523 and 743 have respective lower ends that are open downwardly. The water nozzle 52 and the abrasive grain nozzle 74 can be turned horizontally about their vertical portions 521 and 741 by the turning mechanism 83 illustrated in FIG. 5. The turning mechanism 83 is provided as the horizontally moving mechanism referred to above.

The ultrasonic horn 75 is mounted on a distal end of a support arm 85. The support arm 85 includes a vertical portion 851 rising vertically, a horizontal portion 852 bent at a right angle from an upper end of the vertical portion 851 and extending horizontally, and a vertical portion 853 bent at a right angle from a distal end of the horizontal portion 852 and extending downwardly. The ultrasonic horn 75 is shaped as an elongate slender rectangular block mounted on a lower end of the vertical portion 853. The support arm 85 and the ultrasonic horn 75 can be vertically moved by a lifting and lowering mechanism 86 illustrated in FIG. 7 and can be horizontally turned about the vertical portion 851 of the support arm 85 by a turning mechanism 87.

Figure 8:
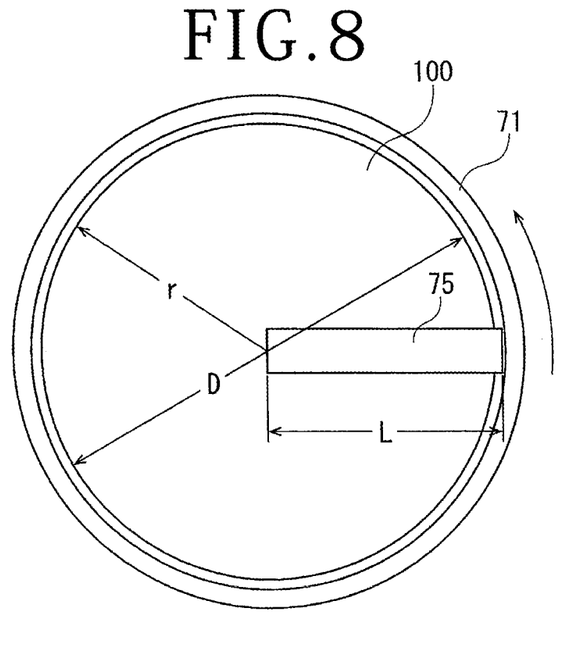
FIG. 8 is a plan view illustrating a positional relation between an ultrasonic horn of the gettering layer forming device according to the present embodiment and the wafer.

As illustrated in FIG. 8, the ultrasonic horn 75 has a length L set to a value in the range from the radius r of the wafer 100 to the diameter D of the wafer 100 (r≤L≤D). An ultrasonic oscillator, not illustrated, is connected to the ultrasonic horn 75.

The spinner table 51, the water nozzle 52, the abrasive grain nozzle 74, the ultrasonic horn 75, etc. are housed in a case 88 that is of an upwardly open, polygonal tubular shape. A bottomed cover 89 having a polygonal tubular shape is vertically telescopically disposed in the case 88. A bracket 90 shaped as a rectangular plate protrudes horizontally from an upper end of the cover 89 and coupled to two rods 911 (see FIG. 10) that extend vertically upwardly from a lifting and lowering mechanism 91 such as an air cylinder. Therefore, the cover 89 can be vertically moved with respect to the case 88 by the lifting and lowering mechanism 91. In FIG. 2, the cover 89 is positioned in a lower limit position with respect to the case 88 and is in an open state.

[Operation of the Grinding Apparatus 1]

A method of grinding the wafer 100 and a method of forming a gettering layer on the reverse side of the wafer 100 that has been ground, which are carried out on the grinding apparatus 1 thus constructed, will be described below.

The grinding apparatus 1 according to the present embodiment grinds the wafer 100 and forms a gettering layer on the wafer 100 by successively performing four steps including a holding step, a grinding step, a gettering layer forming step, and a cleaning step. These steps will be described in detail below.

(Holding Step)

The holding step is a step of holding the wafer 100 under suction on the chuck holding surface 11 of the chuck table 10. In the holding step, the loading and unloading robot 61 illustrated in FIG. 1 takes the wafer 100 from the cassette 101 and places the wafer 100 on the positioning table 102. The positioning table 102 positions the wafer 100 thereon. Then, the first delivery arm 62 holds and delivers the wafer 100 from the positioning table 102 to the chuck table 10.

On the chuck table 10, the wafer 100 is placed on the chuck holding surface 11 with the reverse side, i.e., a surface to be ground, of the wafer 100 facing upwardly. Then, a suction source such as a vacuum pump that is fluidly connected to the chuck table 10 is actuated to remove air from the porous member 12, developing a negative pressure in the porous member 12. The wafer 100 is now held under suction on the chuck holding surface 11 by the negative pressure developed in the porous member 12.

(Grinding Step)

The grinding step is a step of grinding, with the grinding mechanism 30 illustrated in FIG. 1, the wafer 100 that has been held under suction on the chuck holding surface 11 of the chuck table 10 in the holding step. In the grinding step, the horizontally moving mechanism 20 illustrated in FIG. 1 moves the chuck table 10 and the wafer 100 held under suction thereon to a position below the grinding wheel 35 of the grinding mechanism 30 and positions the chuck table 10 and the wafer 100 in the position.

Specifically, when the electric motor 24 of the horizontally moving mechanism 20 is energized to rotate the ball screw shaft 23 about its own central axis, the slider 21 with the nut, not illustrated, fixed thereto and operatively threaded over the ball screw shaft 23 is slid with the chuck table 10 in the +Y direction along the guide rails 22 until the wafer 100 held on the chuck holding surface 11 of the chuck table 10 is positioned below the grinding wheel 35 of the grinding mechanism 30. At this time, the horizontal positional relation between the grindstones 352 and the wafer 100 is adjusted such that the lower surfaces, i.e., the processing surface, of the grindstones 352 will pass over the center of the wafer 100.

The rotating mechanism 14 illustrated in FIG. 1 is energized to rotate the chuck table 10 about its own central axis, rotating the wafer 100 held on the chuck holding surface 11 of the chuck table 10 at a predetermined rotational speed in the direction indicated by the arrow in FIG. 1, i.e., counterclockwise. At the same time, the spindle motor 32 of the grinding mechanism 30 is energized to rotate the grinding wheel 35 at a predetermined speed also in the direction indicated by the arrow in FIG. 1, i.e., counterclockwise.

While the wafer 100 and the grinding wheel 35 are rotating as described above, the vertically moving mechanism 40 is actuated to lower the grinding wheel 35 in the −Z direction. Specifically, the electric motor 44 is energized to rotate the ball screw shaft 43 about its own central axis, lowering the vertically movable plate 41 with the nut, not illustrated, fixed thereto and operatively threaded over the ball screw shaft 43 in the −Z direction together with the spindle motor 32 and the grinding wheel 35. The lower surfaces, i.e., the processing surface, of the grindstones 352 of the grinding wheel 35 are now brought into contact with the upper surface, i.e., the reverse side, of the wafer 100. When the grinding wheel 35 is further lowered by a predetermined amount in the −Z direction after the lower surfaces of the grindstones 352 have contacted the upper surface of the wafer 100, the grindstones 352 grind off a certain amount of wafer material from the upper surface, i.e., the reverse side, of the wafer 100. The thickness of the wafer 100 that is being ground by the grindstones 352 is measured by the thickness measuring instrument 26, and the measured thickness value is transmitted to the non-illustrated controller.

(Gettering Layer Forming Step)

The gettering layer forming step is a step of forming a gettering layer on the reverse side of the wafer 100 that has been ground in the preceding grinding step. In preparation for forming a gettering layer on the reverse side of the wafer 100, while the annular member 71 of the gettering layer forming device 70 is standing by above the spinner table 51 as illustrated in FIG. 2, the wafer 100 that has been ground is held by the second delivery arm 63 illustrated in FIG. 1 and delivered from the chuck table 10 to the spinner table 51 of the spinner cleaning mechanism 50. The wafer 100 that has been delivered to the spinner table 51 is held under suction on the spinner holding surface 511 of the spinner table 51.

Figure 3:
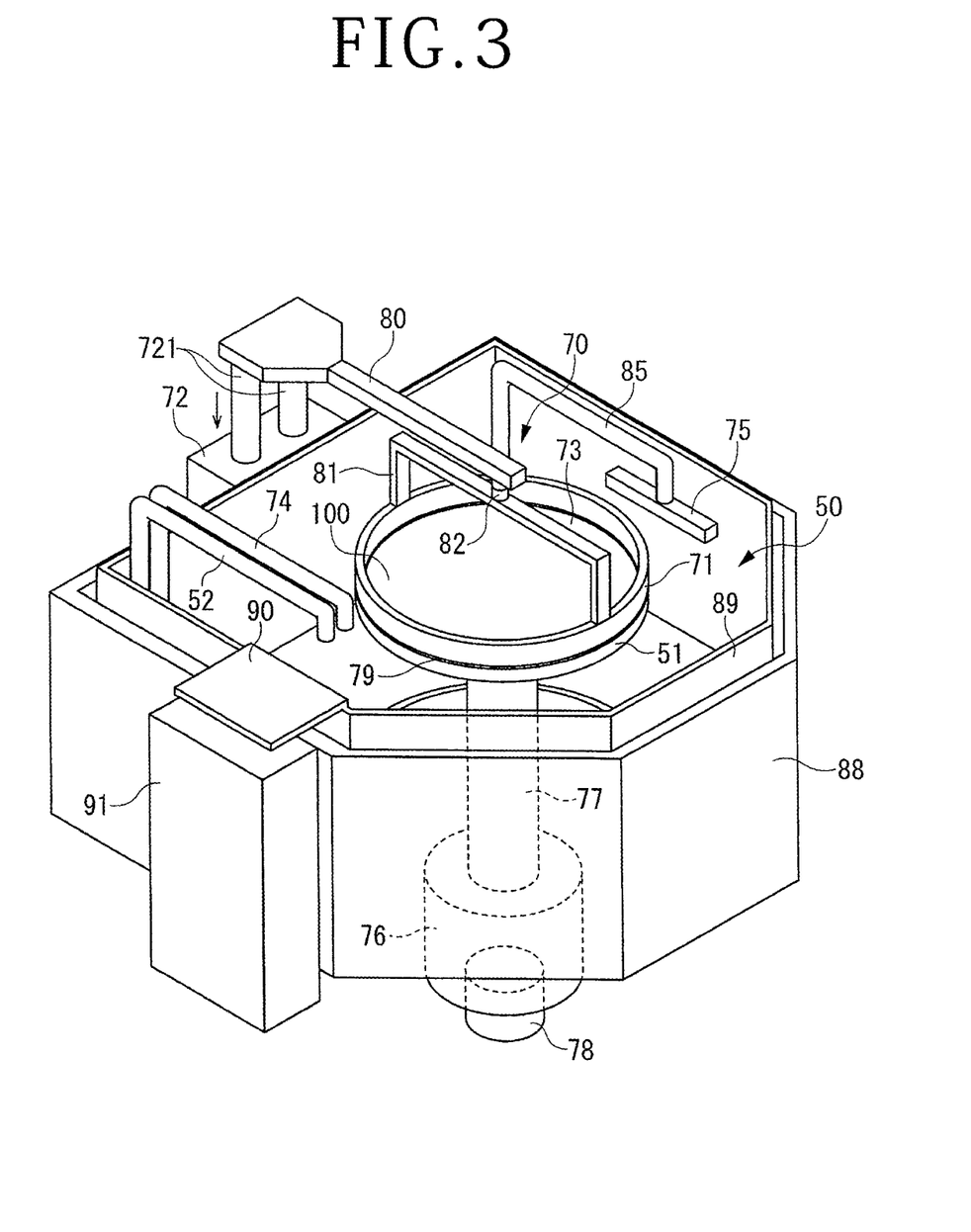
FIG. 3 is a perspective view of the grinding apparatus, illustrating a state of operation in which the annular member of the gettering layer forming device according to the present embodiment has been placed on the spinner table.

The moving mechanism 72 is then actuated to lower the two rods 721, lowering the arm 80 extending horizontally from the upper ends of the rods 721 and the annular member 71 supported on the distal end of the arm 80 until the annular member 71 is placed on the annular rest surface 512 (see FIG. 2) on an outer circumferential portion of the upper surface of the spinner table 51 around the spinner holding surface 511 of the spinner table 51, as illustrated in FIG. 3. When the annular member 71 is thus placed on the annular rest surface 512 of the spinner table 51, the wafer 100 held under suction on the spinner holding surface 511 of the spinner table 51 is surrounded by the annular member 71. The annular member 71 and the wafer 100 jointly define the water bath 73. At this time, the elastic packing 79 attached to the lower surface of the annular member 71 exerts sealing action to provide a highly watertight seal between the annular member 71 and the annular rest surface 512 of the spinner table 51. The wafer 100 acts as a bottom surface of the water bath 73.

While the gettering layer forming device 70 is operating until the water bath 73 is defined by the annular member 71 and the wafer 100, the water nozzle 52, the abrasive grain nozzle 74, and the ultrasonic horn 75 are retracted in their home positions away from the spinner table 51 and the annular member 71, as illustrated in FIG. 3.

Figure 4:
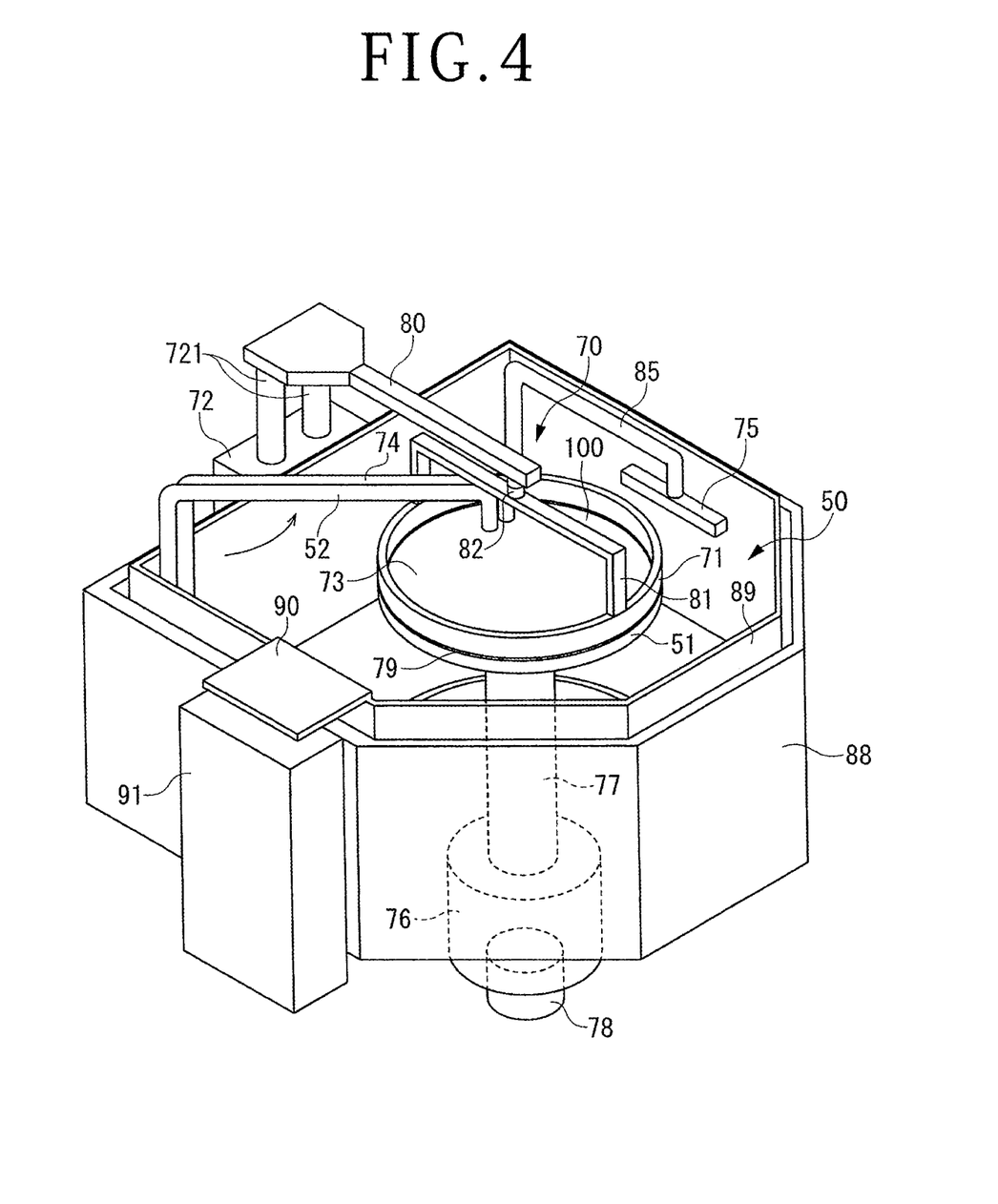
FIG. 4 is a perspective view of the grinding apparatus, illustrating a state of operation in which water and free abrasive grains are being supplied to a water bath provided between the annular member of the gettering layer forming device and a wafer.
Figure 5:
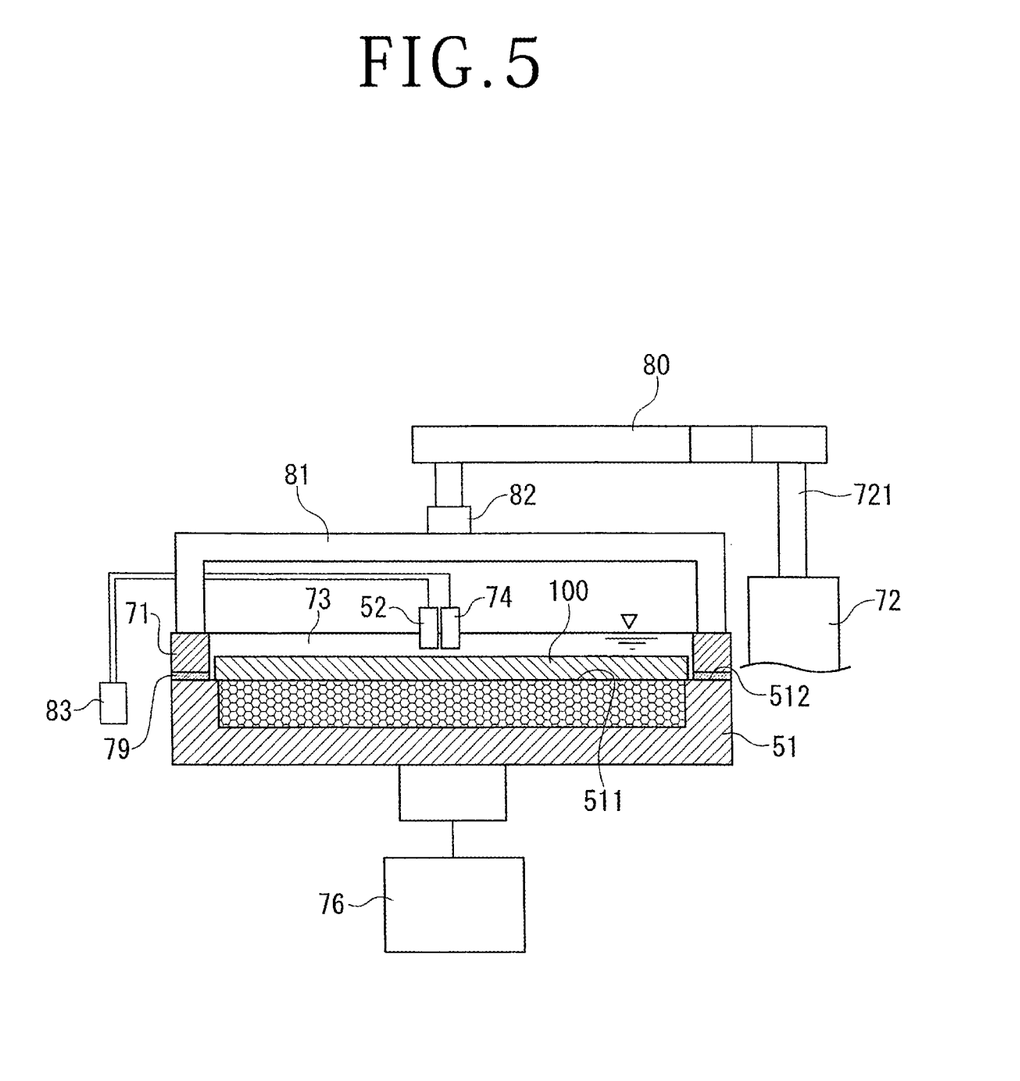
FIG. 5 is a cross-sectional view of the grinding apparatus, illustrating the state of operation in which the water and the free abrasive grains are being supplied to the water bath provided between the annular member of the gettering layer forming device and the wafer.

After the water bath 73 has been defined on the spinner table 51 by the annular member 71 and the wafer 100, the turning mechanism 83 illustrated in FIG. 5 is actuated to turn the horizontal portions 522 and 742 (see FIG. 2) of the water nozzle 52 and the abrasive grain nozzle 74 horizontally about the vertical portions 521 and 741 thereof in the direction indicated by the arrow in FIG. 4 from their home positions illustrated in FIG. 3 until the open lower ends of the vertical portions 523 and 743 (see FIG. 2) of the water nozzle 52 and the abrasive grain nozzle 74 are positioned over the water bath 73. Then, the water nozzle 52 and the abrasive grain nozzle 74 supply water and abrasive grains, respectively, to the water bath 73 until the water bath 73 is filled with water containing free abrasive grains, as illustrated in FIG. 5, when the wafer 100 held on the spinner holding surface 511 of the spinner table 51 is immersed in the water in the water bath 73.

Figure 6:
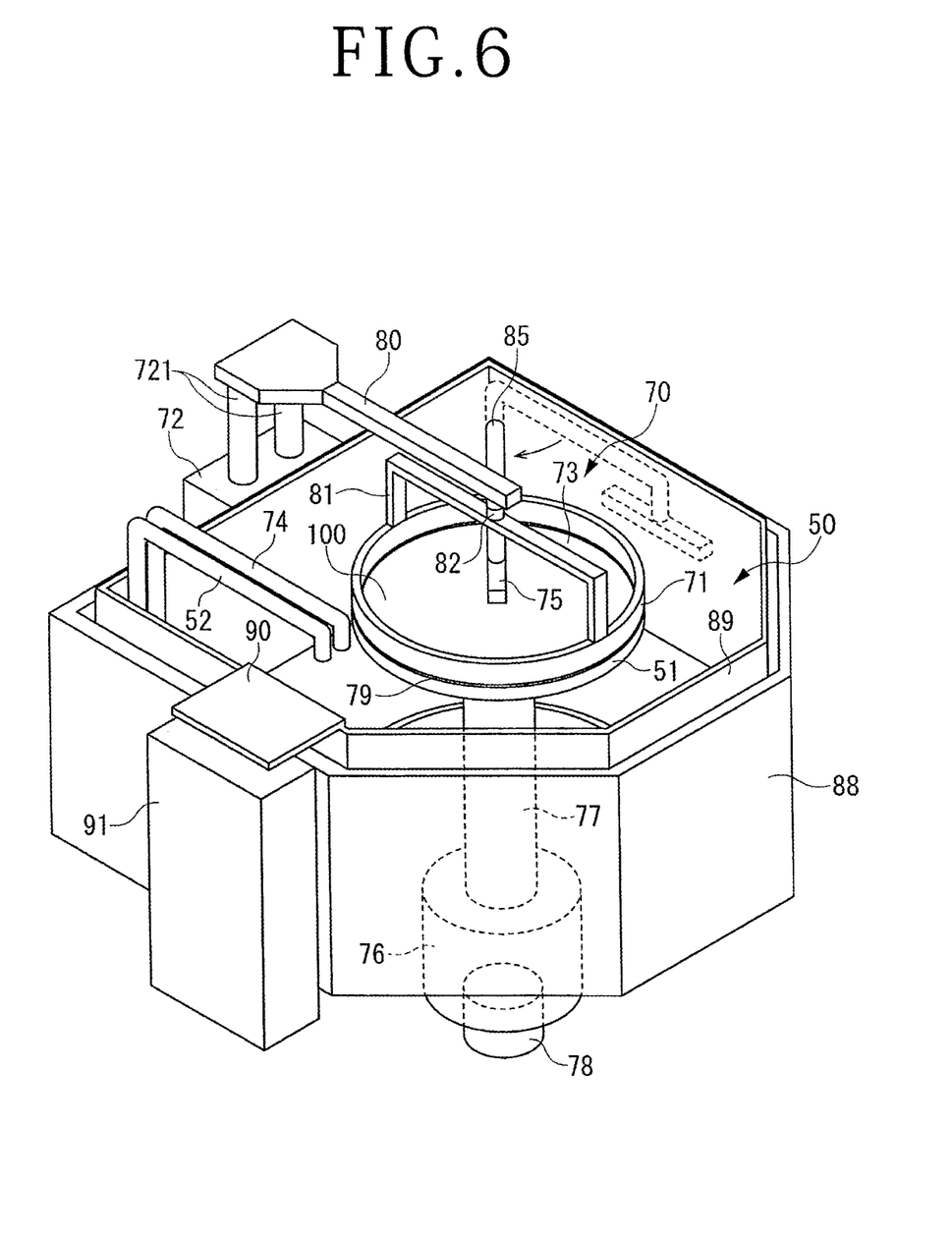
FIG. 6 is a perspective view of the grinding apparatus, illustrating a state of operation in which ultrasonic vibrations are being propagated to the free abrasive grains supplied to the water bath of the gettering layer forming device according to the present embodiment.

Then, the turning mechanism 83 illustrated in FIG. 5 is actuated again to turn the horizontal portions 522 and 742 of the water nozzle 52 and the abrasive grain nozzle 74 horizontally back to their home positions, as illustrated in FIG. 6. The turning mechanism 87 illustrated in FIG. 7 is actuated to turn the horizontal portion 852 of the support arm 85 horizontally about the vertical portion 851 (see FIG. 2) in the direction indicated by the arrow in FIG. 6, thereby moving the ultrasonic horn 75 supported by the support arm 85 from its home position indicated by the broken lines in FIG. 6 to a solid-line position in FIG. 6 over the wafer 100 on the spinner table 51.

Figure 7:
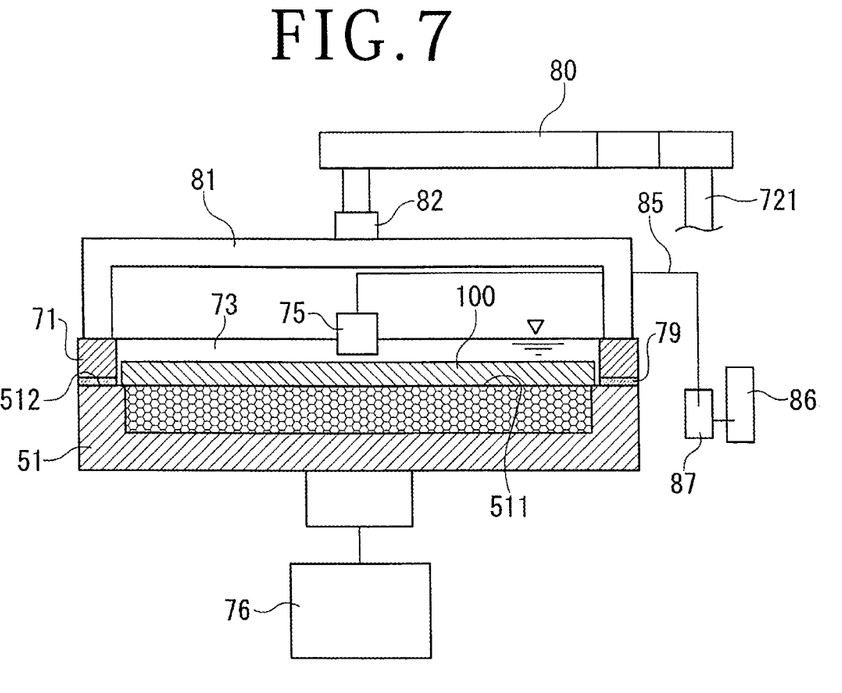
FIG. 7 is a cross-sectional view of the grinding apparatus, illustrating the state of operation in which the ultrasonic vibrations are being propagated to the free abrasive grains supplied to the water bath of the gettering layer forming device according to the present embodiment.

Then, the lifting and lowering mechanism 86 is actuated to lower the support arm 85 and the ultrasonic horn 75 supported thereby until the ultrasonic horn 75 is immersed in the water in the water bath 73, as illustrated in FIG. 7. The ultrasonic horn 75 thus immersed in the water in the water bath 73 extends from the center of the wafer 100 to an outer circumferential end thereof, as illustrated in FIG. 8.

Next, the rotating mechanism 76 illustrated in FIG. 6 is actuated to rotate the spinner table 51 and the wafer 100 held under suction thereon in the direction indicated by the arrow in FIG. 8, i.e., counterclockwise, at a low speed. While the wafer 100 is being thus rotated, the ultrasonic horn 75 is actuated to propagate ultrasonic vibrations to the free abrasive grains contained in the water in the water bath 73. The free abrasive grains are ultrasonically vibrated to leave countless minuscule scratches on the reverse side of the wafer 100, thereby forming a gettering layer on the reverse side of the wafer 100. According to the present embodiment, those free abrasive grains that are contained in the water at shallow depths are ultrasonically vibrated while being kept on the reverse side of the wafer 100 at all times, so that the free abrasive grains move in lateral directions and oblique directions and leave criss-cross minuscule scratches on the reverse side of the wafer 100. Consequently, a gettering layer for trapping and securing impurities such as heavy-metal impurities tending to cause metal contamination in the gettering sites is efficiently formed on the reverse side of the wafer 100 within a short period of time.

Figure 9:
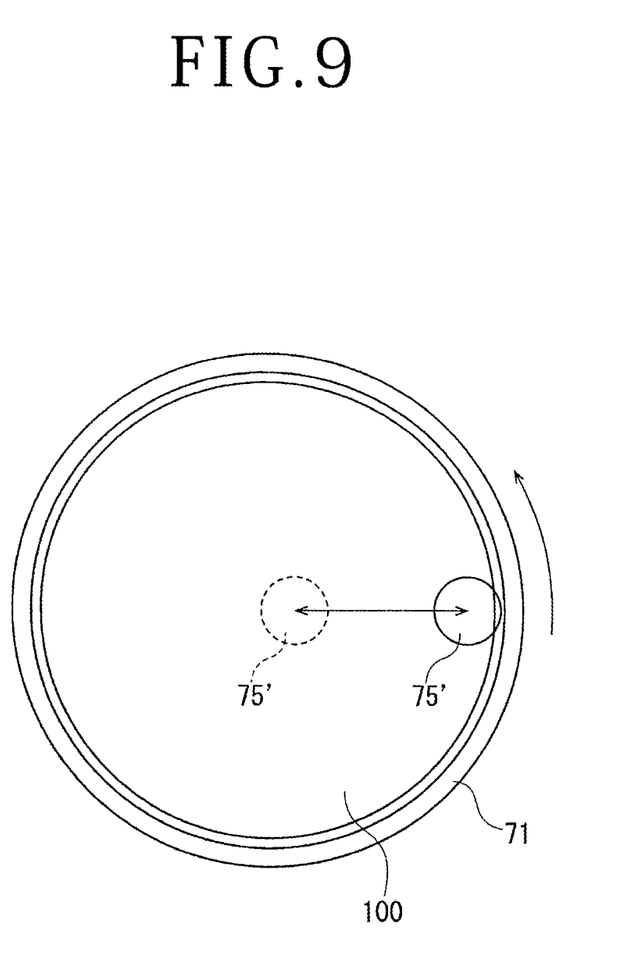
FIG. 9 is a plan view illustrating another positional relation between an ultrasonic horn of the gettering layer forming device according to the present embodiment and the wafer.

According to the present embodiment, as illustrated in FIG. 8, since the length L of the ultrasonic horn 75 is set to a value in the range from the radius r of the wafer 100 to the diameter D of the wafer 100 ($r \leq L \leq D$), when the spinner table 51 and the wafer 100 held thereon are rotated in the direction indicated by the arrow in FIG. 8, a gettering layer is formed uniformly on the entire reverse side of the wafer 100. According to the present embodiment, the ultrasonic horn 75 is shaped as an elongate slender rectangular block. However, as illustrated in FIG. 9, there may alternatively be used a small circular ultrasonic horn 75' that may be reciprocally moved radially in the directions indicated by the arrow in a range between the center to an outer circumferential end of the wafer 100 for forming a uniform gettering layer on the entire reverse side of the wafer 100.

Figure 10:
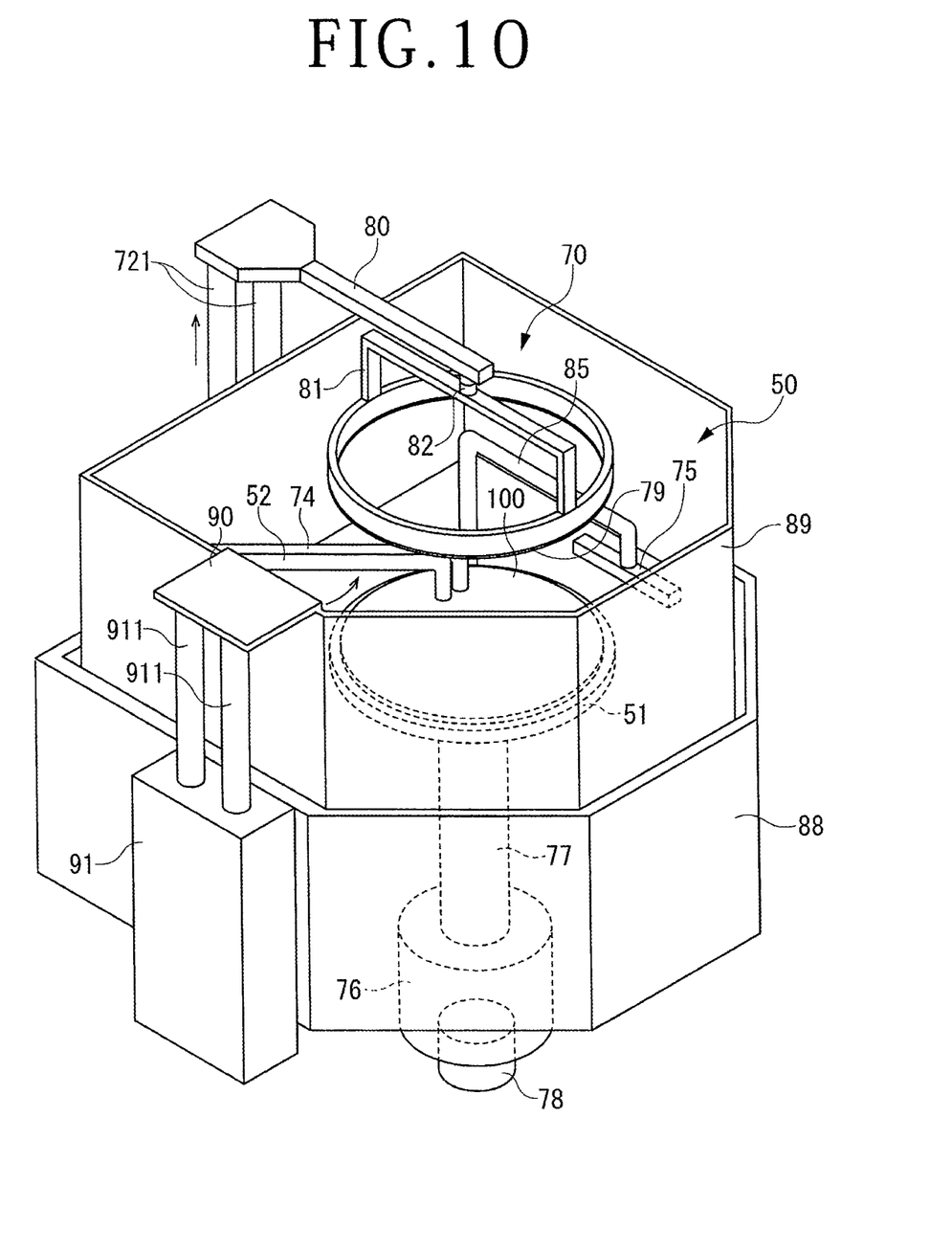
FIG. 10 is a cross-sectional view of the grinding apparatus, illustrating a state of operation in which the annular member is lifted after a gettering layer has been formed on a reverse side of the wafer by the gettering layer forming device according to the present embodiment.

After the gettering layer has been formed on the reverse side of the wafer 100 through the above steps, the lifting and lowering mechanism 86 illustrated in FIG. 7 is actuated to lift the ultrasonic horn 75 to a predetermined height, and the turning mechanism 87 is actuated to turn the ultrasonic horn 75 horizontally back to the home position illustrated in FIG. 10. The moving mechanism 72 is actuated to lift the annular member 71 back to its home position illustrated in FIG. 10. The lifting and lowering mechanism 91 is actuated to elevate the cover 89 to cover the periphery of the spinner table 51 with the cover 89.

When the annular member 71 is lifted off the annular rest surface 512 (see FIG. 2) of the spinner table 51, free abrasive grains flow with water down from an outer circumferential edge of the spinner table 51. The free abrasive grains flowing down from the spinner table 51 would be wasted.

It is desirable to retrieve and reuse the free abrasive grains flowing down from the outer circumferential edge of the spinner table 51. An abrasive grain retrieval system for retrieving the free abrasive grains is illustrated in FIG. 11.

Figure 11:
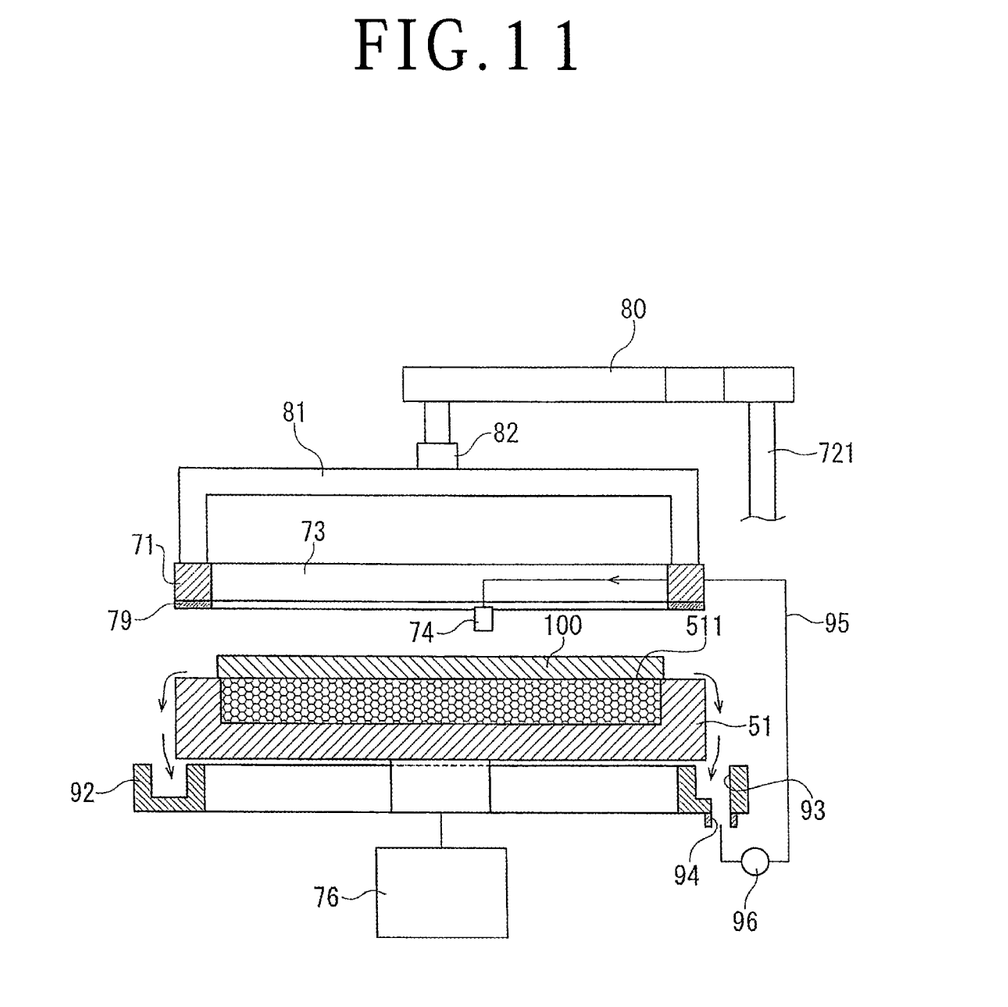
FIG. 11 is a cross-sectional view of the grinding apparatus, illustrating the structure of an abrasive grain retrieval system for retrieving and reusing the abrasive grains that have been used to form a gettering layer by the gettering layer forming device according to the present embodiment.

As illustrated in FIG. 11, the abrasive grain retrieval system includes an annular receptacle 92 disposed beneath the spinner table 51 and having an annular retrieval slot 93 defined therein that is open upwardly. The annular retrieval slot 93 is positioned below the outer circumferential edge of the spinner table 51. The annular receptacle 92 also has a drain hole 94 defined therein that is open into a portion of the retrieval slot 93. The drain hole 94 is fluidly connected to the abrasive grain nozzle 74 by a retrieval line 95. A pump 96 is connected to the retrieval line 95.

The abrasive grain retrieval system thus constructed operates as follows. After a gettering layer has been formed on the reverse side of the wafer 100, the annular member 71 is lifted, allowing the free abrasive grains to flow with water down from the outer circumferential edge of the spinner table 51. The free abrasive grains flowing down from the spinner table 51 drop into and are retrieved by the retrieval slot 93. The free abrasive grains retrieved with the water by the retrieval slot 93 are returned via the retrieval line 95 to the abrasive grain nozzle 74 by the pump 96 and will be reused to form a gettering layer on the reverse side of the wafer 100.

(Cleaning Step)

The cleaning step is a step of cleaning the reverse side of the wafer 100 on which the gettering layer has been formed in the gettering layer forming step. In the cleaning step, as illustrated in FIG. 10, the reverse side of the wafer 100 is cleaned by the spinner cleaning mechanism 50 while the periphery of the spinner table 51 is being covered with the cover 89 that is elevated, as illustrated in FIG. 10.

Specifically, the turning mechanism 83 illustrated in FIG. 5 is actuated to turn the water nozzle 52, also used as a water nozzle, and the abrasive grain nozzle 74 retracted in their home positions in the preceding gettering layer forming step, horizontally to the position over the wafer 100 where the water nozzle 52 and the abrasive grain nozzle 74 are open toward the wafer 100, as illustrated in FIG. 10.

Then, the water nozzle 52 ejects a cleaning fluid toward the reverse side, i.e., the upper surface, of the wafer 100 to clean the reverse side of the wafer 100 with the cleaning fluid, thereby effectively removing foreign matter such as free abrasive grains and swarf from the reverse side of the wafer 100.

Thereafter, the wafer 100 whose reverse side has been cleaned is held under suction by the loading and unloading robot 61 illustrated in FIG. 1, is delivered from the spinner table 51 to the cassette 103, and is stored back into the cassette 103. The steps successively performed on the wafer 100, including the grinding step and the gettering layer forming step, now come to an end.

As described above, the gettering layer forming device 70 and the grinding apparatus 1 that incorporates the gettering layer forming device 70 are advantageous in that they are capable of forming a gettering layer on the reverse side of the wafer 100 that has been ground, efficiently in a short period of time.

According to the embodiment described above, the gettering layer forming device 70 is integrally incorporated in the grinding apparatus 1. However, the gettering layer forming device 70 may be integrally combined with the grinding mechanism 30. If the gettering layer forming device 70 is integrally combined with the grinding mechanism 30, then the annular member 71 is placed on the annular rest surface 13 (see FIG. 1) as the outer circumferential upper surface of the chuck holding surface 11 of the chuck table 10, so that the water bath 73 is defined by the annular member 71 and the wafer 100.

The present invention has been illustrated as applied to a grinding apparatus and a gettering layer forming device incorporated in the grinding apparatus. However, the principles of the present invention are also applicable to a processing apparatus such as a polishing apparatus other than a grinding apparatus and a gettering layer forming device incorporated in the processing apparatus.

The present invention is not limited to the embodiment described above. Various changes and modifications may be made in the embodiment within the scope of the present invention as described in the claims, the description, and the drawings.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A gettering layer forming device for forming a gettering layer on a reverse side of a wafer, comprising:
    a holding table having a holding surface for holding a face side of the wafer under suction thereon and an annular rest surface disposed radially outwardly of the holding surface;
    an annular member for being placed on the annular rest surface in surrounding relation to the wafer held on the holding surface such that a water bath is defined by the annular member and the wafer;
    a moving mechanism for selectively placing the annular member onto the annular rest surface and moving the annular member away from the annular rest surface;
    an abrasive grain charger for charging free abrasive grains into the water bath;
    a water nozzle for supplying water to the water bath to immerse the wafer in the water in the water bath;
    an ultrasonic horn for propagating ultrasonic vibrations to the free abrasive grains in the water in the water bath; and
    a horizontally moving mechanism for moving the ultrasonic horn and the holding table horizontally relatively to each other in directions parallel to the holding surface,
    wherein the gettering layer is formed on the reverse side of the wafer held on the holding surface and immersed in the water in the water bath by the free abrasive grains to which the ultrasonic vibrations are propagated by the ultrasonic horn.

2. The gettering layer forming device according to claim 1,
    wherein the ultrasonic horn extends along a length ranging from a radius of the wafer to a diameter of the wafer, and
    the gettering layer forming device further includes a rotating mechanism for rotating the holding table about an axis aligned with a center of the holding surface.

3. The gettering layer forming device according to claim 1, further comprising an annular seal member positioned between a lower surface of the annular member and the annular rest surface of the holding table.

4. A processing apparatus for processing a reverse side of a wafer, comprising:
    a chuck table having a chuck holding surface for holding a face side of the wafer thereon and an annular rest surface disposed radially outwardly of the chuck holding surface;
    a processing mechanism for processing the wafer held on the chuck table; and
    a gettering layer forming device for forming a gettering layer on the reverse side of the wafer,
    wherein the gettering layer forming device includes:
        an annular member including a lower surface thereof, where the lower surface of the annular member is configured and arranged to be placed on the annular rest surface in surrounding relation to the wafer held on the chuck holding surface such that a water bath is defined by the annular member and the wafer,
        an abrasive grain charger for charging free abrasive grains into the water bath,
        a water nozzle for supplying water to the water bath to immerse the wafer in the water in the water bath,
        an ultrasonic horn for propagating ultrasonic vibrations to the free abrasive grains in the water in the water bath, and
        a horizontally moving mechanism for moving the ultrasonic horn and the chuck table horizontally relatively to each other in directions parallel to the chuck holding surface, and
    wherein a gettering layer is formed on the reverse side of the wafer held on the chuck holding surface and immersed in the water in the water bath by the free abrasive grains to which the ultrasonic vibrations are propagated by the ultrasonic horn.

5. The processing apparatus according to claim 4, further comprising an annular seal member positioned between the lower surface of the annular member and the annular rest surface of the holding table.

6. A processing apparatus for processing a reverse side of a wafer, comprising:
    a chuck table having a chuck holding surface for holding a face side of the wafer thereon;
    a processing mechanism for processing the reverse side of the wafer held on the chuck holding surface;

a spinner cleaning mechanism for cleaning the wafer;
a delivery mechanism for delivering the wafer from the chuck table to the spinner cleaning mechanism; and
a gettering layer forming device for forming a gettering layer on the reverse side of the wafer,
wherein the spinner cleaning mechanism includes:
- a spinner table having a spinner holding surface for holding the face side of the wafer thereon and an annular rest surface disposed radially outwardly of the spinner holding surface,
- a cleaning nozzle for ejecting a cleaning fluid to the reverse side of the wafer held on the spinner holding surface,
- a rotating mechanism for rotating the spinner table about an axis aligned with a center of the spinner holding surface, and
- a gettering layer forming device for forming a gettering layer on the reverse side of the wafer, wherein the gettering layer forming device includes:
- an annular member including a lower surface thereof, where the lower surface of the annular member is configured and arranged to be placed on the annular rest surface in surrounding relation to the wafer held on the spinner holding surface such that a water bath is defined by the annular member and the wafer,
- an abrasive grain charger for charging free abrasive grains into the water bath, and
- an ultrasonic horn for propagating ultrasonic vibrations to the free abrasive grains in the water in the water bath, wherein the rotating mechanism rotates the spinner table while the wafer held on the spinner holding surface is being immersed in water supplied from the cleaning nozzle to the water bath, and a gettering layer is formed on the reverse side of the wafer held on the spinner holding surface and immersed in the water in the water bath by the free abrasive grains to which the ultrasonic vibrations are propagated by the ultrasonic horn.

7. The processing apparatus according to claim 6, further comprising an annular seal member positioned between the lower surface of the annular member and the annular rest surface of the holding table.

* * * * *